United States Patent [19]
Lin

[11] Patent Number: 6,125,924
[45] Date of Patent: Oct. 3, 2000

[54] HEAT-DISSIPATING DEVICE

[76] Inventor: Hao-Cheng Lin, No. 281, Hsi-Ning S. Rd., Wan-Hwa Dist., Taipei City, Taiwan

[21] Appl. No.: 09/303,566

[22] Filed: May 3, 1999

[51] Int. Cl.[7] ................................................. H05K 7/20
[52] U.S. Cl. ........................ 165/122; 165/80.3; 361/697
[58] Field of Search ................................ 165/80.3, 122; 361/695, 696, 697

[56] References Cited

U.S. PATENT DOCUMENTS

| | | | |
|---|---|---|---|
| 5,727,624 | 3/1998 | Ko et al. | 165/121 |
| 5,838,066 | 11/1998 | Kitajo | 257/722 |
| 5,917,697 | 6/1999 | Wang | 361/695 |
| 5,940,269 | 8/1999 | Ko et al. | 361/697 |
| 5,978,219 | 11/1999 | Lin | 361/697 |

*Primary Examiner*—Allen Flanigan
*Attorney, Agent, or Firm*—Sughrue, Mion, Zinn, Macpeak & Seas, PLLC

[57] ABSTRACT

A heat-dissipating device for a computer includes a base, a heat-dissipating fan, a cover plate, and an air guiding tube. The base is made of a heat-conducting metal, and includes a base plate to be disposed in contact with an electronic component in a computer housing, and a surrounding wall which extends upwardly and integrally from a periphery of the base plate. The surrounding wall includes a front portion that confines a receiving space with the base plate, and a pair of spaced-apart guiding wall members which extend rearwardly and respectively from rear ends of the front portion. The fan is mounted on the base plate inside the receiving space for drawing air downwardly toward the base plate. The cover plate is disposed on a top edge of the surrounding wall, and has a front part formed with an opening which is located immediately over the fan, and a rear part which confines an air passage with the guiding wall members and the base plate. The air passage has an open rear end. The air guiding tube has a first end connected to the base and communicated fluidly with the open rear end of the air passage, and a second end to be mounted on the computer housing around a vent hole in the latter so as to be communicated fluidly with an exterior of the computer housing.

6 Claims, 4 Drawing Sheets

HEAT-DISSIPATING DEVICE

BACKGROUND OF THE INVENTION

1. Field of the Invention

This invention relates to a heat-dissipating device for the cooling of electronic components in a housing of an electronic device, more particularly to a heat-dissipating device which includes a fan and an air guiding tube for effectively discharging the heat that is generated by the electronic components to an exterior of the housing of the electronic device.

2. Description of the Related Art

Heat-dissipating devices for the cooling of electronic components in a computer are known in the art. FIG. 1 illustrates a conventional heat-dissipating device 1 for the cooling of a central processing unit (CPU) inside a housing of a computer. The heat-dissipating device includes a base 11 made of a heat-conducting material, and a fan 12 mounted on the base 11. The base 11 is disposed in contact with the CPU such that the heat generated during the operation of the CPU can be transmitted directly to the base 11. The fan 12 draws cooling air from an interior of the computer housing toward the base 11 such that the heat is carried by the cooling air, thereby cooling the base 11 and reducing the temperature of the CPU. However, after the cooling air carries the heat, the resulting hot air cannot be effectively discharged out of the computer housing. Therefore, the temperature within the computer housing will increase after the computer is operated for a period of time. At this time, the temperature of the cooling air drawn by the fan 12 is correspondingly increased. Thus, the cooling effect achieved using the conventional heat-dissipating device 1 of FIG. 1 is unsatisfactory, and the temperature of the CPU cannot be kept within a range that ensures stable operation thereof.

In order to solve the aforementioned problem, another kind of heat-dissipating device has been developed. This kind of heat-dissipating device includes a fin plate mounted on the CPU, a fan mounted on the fin plate, and an air guiding tube for guiding cooling air from an exterior of the computer housing toward the fan and the fin plate. The cooling air thus carries the heat generated during operation of the CPU, and the temperature of the CPU is lowered. Although this kind of heat-dissipating device ensures that the temperature of the cooling air can be kept at a generally constant low temperature, the resulting hot air is not discharged out of the computer housing immediately. As such, the electronic components of the computer are still exposed to the hot air.

SUMMARY OF THE INVENTION

Therefore, the object of the present invention is to provide a heat-dissipating device capable of effectively discharging hot air to an exterior of the housing of an electronic device, such as a computer, for lowering the temperature of the electronic components in the electronic device.

Accordingly, the heat-dissipating device of the present invention is adapted for use with an electronic device having a housing and a heat-generating electronic component mounted in the housing. The heat-dissipating device includes a base, a heat-dissipating fan, a cover plate, and an air guiding tube. The base is made of a heat-conducting metal, and includes a base plate adapted to be disposed in contact with the electronic component, and a surrounding wall which extends upwardly and integrally from a periphery of the base plate and which has a top edge. The surrounding wall includes a generally U-shaped front portion that has two rear ends and that cooperates with the base plate to confine a receiving space, and a rear portion that includes a pair of spaced-apart guiding wall members which extend rearwardly and respectively from the rear ends of the front portion. The receiving space has a top opening. The heat-dissipating fan is disposed in the receiving space, and is mounted on the base plate. The cover plate is mounted on the base, and is disposed on the top edge of the surrounding wall. The cover plate has a front part formed with an opening which is located immediately over the fan, and a rear part which cooperates with the guiding wall members of the surrounding wall and the base plate to confine an air passage. The air passage is communicated fluidly with the receiving space, and has an open rear end. The air guiding tube has a first end which is connected to the base and which is in fluid communication with the air passage, and a second end adapted to be mounted on the housing around a vent hole in the latter so as to be communicated fluidly with an exterior of the housing. The fan has impellers which rotate in a direction so as to draw air from an interior of the housing toward the base plate via the opening in the cover plate, thereby permitting the air to be guided into the air guiding tube through the air passage so that the air can be discharged to the exterior of the housing via the air guiding tube.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
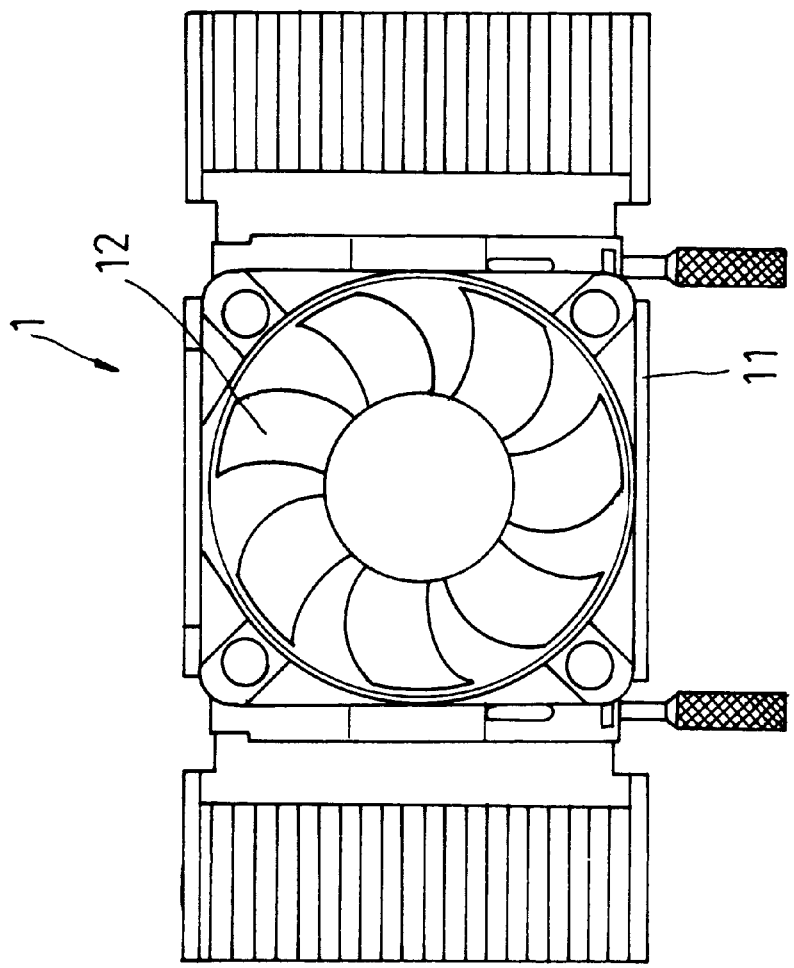
FIG. 1 is a schematic view illustrating a conventional heat-dissipating device for a computer.
Figure 2:
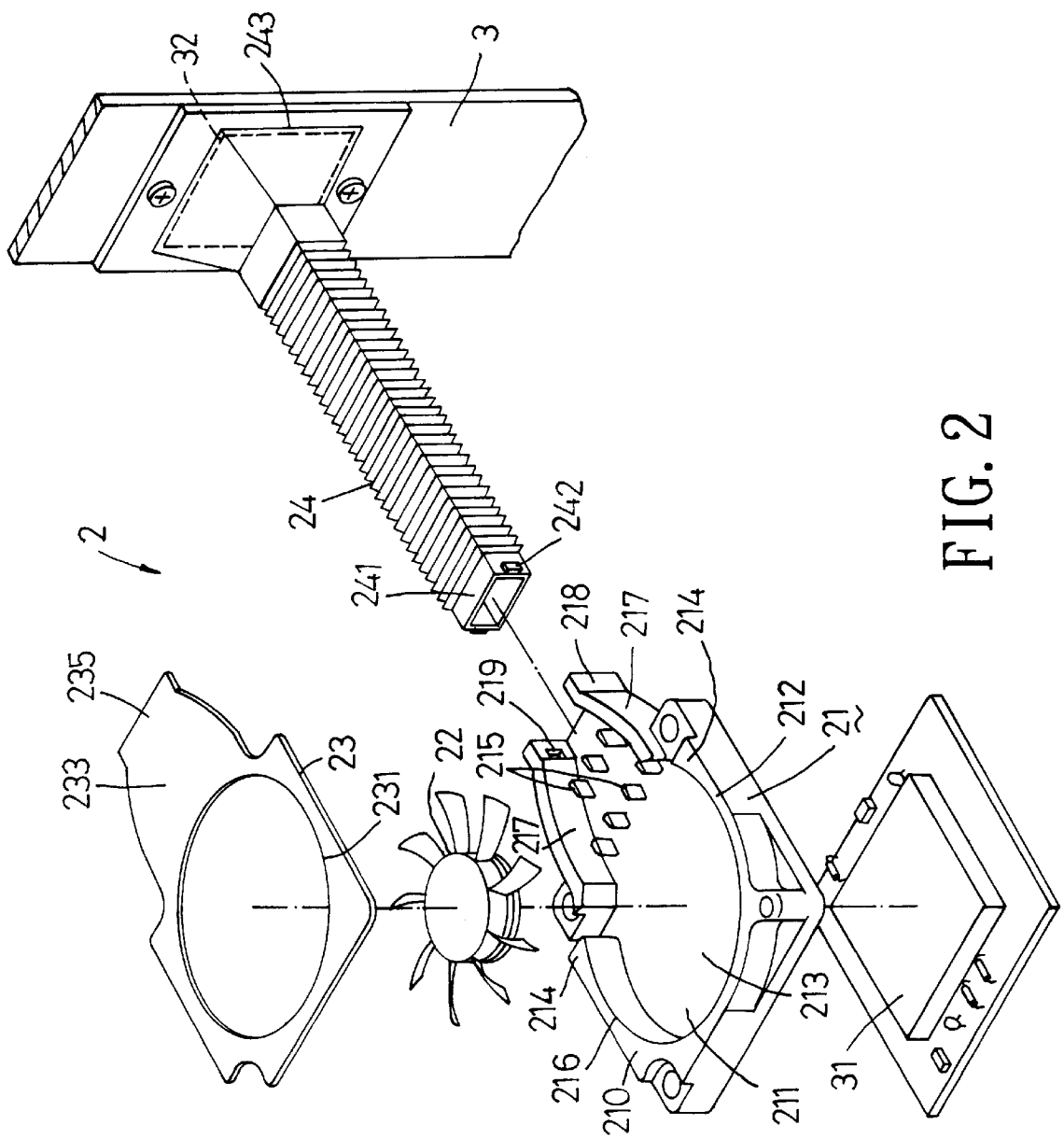
FIG. 2 is an exploded perspective view of a first preferred embodiment of the heat-dissipating device of the present invention.
Figure 3:
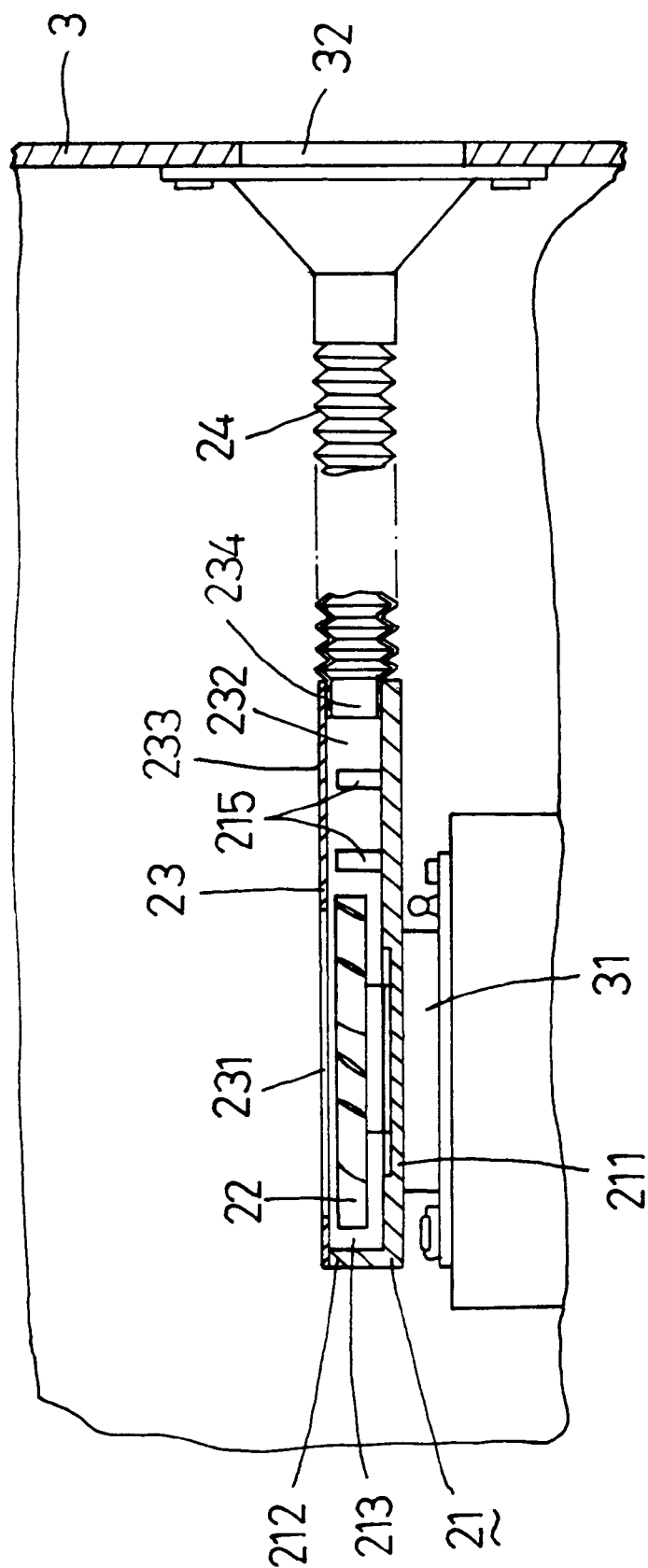
FIG. 3 is a partly sectional schematic view illustrating the heat-dissipating device of the first preferred embodiment.

Referring to FIGS. 2 and 3, the first preferred embodiment of the heat-dissipating device 2 of the present invention is shown to be mounted in an electronic device, such as a computer, for cooling at least one electronic component, such as a CPU 31, that generates heat during operation. The heat-dissipating device 2 is shown to include a base 21, a heat-dissipating fan 22, a cover plate 23, and an air guiding tube 24.

The base 21 is made of a heat-conducting metal, and includes a base plate 211 adapted to be disposed in contact with the CPU 31, and a surrounding wall 212 that extends upwardly and integrally from a periphery of the base plate 211. The surrounding wall 212 has a generally U-shaped front portion 210 with two rear ends 214, and a rear portion which includes a pair of spaced-apart guiding wall members 217 that extend rearwardly and respectively from the rear ends 214 of the front portion 210. The front portion 210 of the surrounding wall 212 cooperates with the base plate 211 to confine a receiving space 213 with a top opening 216. A plurality of fin members 215 that extend upwardly from the base plate 211 are formed between the guiding wall members 217.

The heat-dissipating fan 22 is disposed in the receiving space 213, and is mounted on the base plate 211. The fan 22 has impellers which rotate in a direction for drawing air downwardly toward the base plate 211 via the top opening 216.

The cover plate 23 is disposed on a top edge of the surrounding wall 212 of the base 21, and is mounted on the base 21. The cover plate 23 has a front part which is disposed on the top edge of the front portion 210 of the surrounding wall 212 of the base 21 and which is formed with a circular opening 231 that is located immediately over the fan 22. The circular opening 231 has a diameter slightly smaller than that of the fan 22. The cover plate 23 further has a rear part 233 which is disposed on the top edge of the guiding wall members 217 of the surrounding wall 212. The rear part 233 cooperates with the guiding wall members 217 and the base plate 211 to confine an air passage 232. The air passage 232 converges in a direction away from the fan 22. Each of the guiding wall members 217 has a rear end 218 formed with an engaging groove 219 on an inner side thereof. The cover plate 23 has a rectangular rear end portion 235. The air passage 232 has an open rear end that forms an air outlet 234 which is confined by the rear end portion 235 of the cover plate 23, the rear ends 218 of the guiding wall members 217, and the base plate 211. In this embodiment, the air outlet 234 has a rectangular cross-section.

The air guiding tube 24 has a first end 241 which has a rectangular cross-section and which extends into the air outlet 234. The first end 241 of the air guiding tube 24 has outer sides formed with an opposite pair of engaging protrusions 242 for engaging releasably the engaging grooves 219 in the guiding wall members 217. The air guiding tube 24 further has a second end 243 opposite to the first end 241 and adapted to be mounted on a housing 3 of the computer around a vent hole 32 in the latter such that the air guiding tube 24 is communicated fluidly with an exterior of the housing 3.

In use, the heat generated during operation of the CPU 31 can be transmitted directly to the base plate 211. Since the fan 22 draws the cooling air within the housing 3 toward the base plate 211 through the opening 231 in the cover plate 23, the heat can be carried by the cooling air. The resulting hot air is then guided into the air guiding tube 24 through the air passage 232 due to the action of the fan 22, thereby permitting the hot air to be discharged to the exterior of the housing 3. As such, the temperature of the air within the housing 3 can be kept relatively low to achieve a good heat-dissipating effect.

Figure 4:
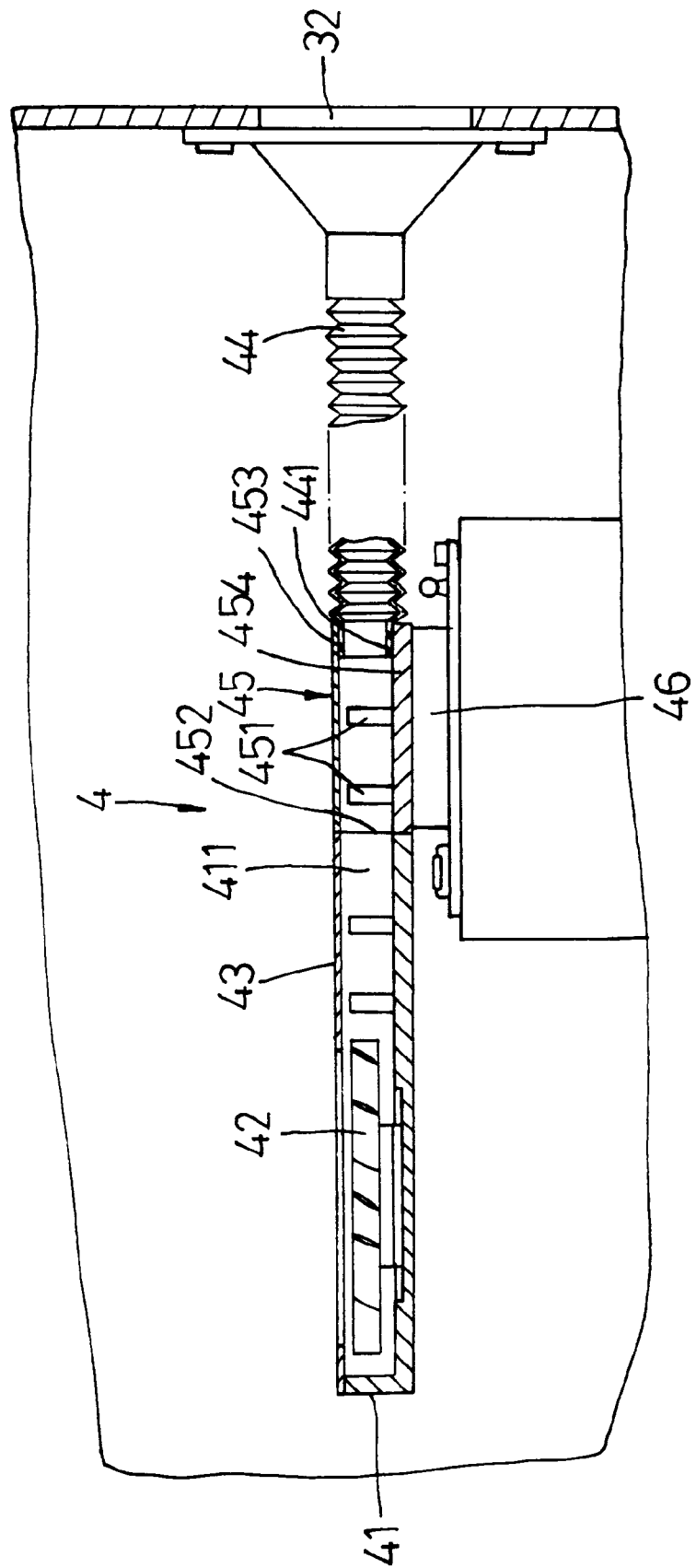
FIG. 4 is a partly sectional schematic view illustrating a second preferred embodiment of the heat-dissipating device of the present invention.

Referring to FIG. 4, the second preferred embodiment of the heat-dissipating device 4 of the present invention is shown to includes a base 41, a heat-dissipating fan 42, a cover plate 43, and an air guiding tube 44 which have structures similar to those in the previous embodiment. The present embodiment differs from the previous embodiment in that a hollow heat-conducting member 45 is provided between the base 41 and the air guiding tube 44 to interconnect the same. The heat-conducting member 45 is made of a heat-conducting metal, and has an open first end 452 connected to the rear ends of the guiding wall members of the surrounding wall of the base 41 and disposed adjacent to the air passage 411 of the base 41, and an open second end 453 connected to the first end 441 of the air guiding tube 44 such that the heat-conducting member 45 is in fluid communication with air passage 411 and the interior of the air guiding tube 44. The heat-conducting member 45 has a base board 454 adapted to be disposed in contact with another heat-generating electronic component 46 of the computer. A plurality of fin members 451 project upwardly from the base board 454 to help dissipate heat from the electronic component 46.

It has thus been shown that, with the use of the heat-dissipating device of this invention, the hot air generated during operation of an electronic component can be immediately and effectively discharged to an exterior of the housing of an electronic device. The heat-dissipating effect is enhanced, and the electronic components in the electronic device can be prevented from prolonged exposure to hot air.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat-dissipating device adapted for use with an electronic device having a housing formed with a vent hole and a heat-generating electronic component mounted in the housing, said heat-dissipating device comprising:

a base made of a heat-conducting metal, said base including a base plate adapted to be disposed in contact with the electronic component, and a surrounding wall which extends upwardly and integrally from a periphery of said base plate and which has a top edge, said surrounding wall including a generally U-shaped front portion that has two rear ends and that cooperates with said base plate to confine a receiving space, and a rear portion that includes a pair of spaced-apart guiding wall members which extend rearwardly and respectively from said rear ends of said front portion, said receiving space having a top opening;

a heat-dissipating fan disposed in said receiving space and mounted on said base plate; a cover plate mounted on said base and disposed on said top edge of said surrounding wall, said cover plate having a front part formed with an opening which is located immediately over said fan, and a rear part which cooperates with said guiding wall members of said surrounding wall and said base plate to confine an air passage, said air passage being communicated fluidly with said receiving space and having an open rear end; and an air guiding tube having a first end which is connected to said base and which is in fluid communication with said air passage, and a second end adapted to be mounted on the housing around the vent hole so as to be communicated fluidly with an exterior of the housing;

said fan having impellers which rotate in a direction so as to draw air from an interior of the housing toward said base plate via said opening in said cover plate, thereby permitting the air to be guided into said air guiding tube through said air passage so that the air can be discharged to the exterior of the housing via said air guiding tube.

2. The heat-dissipating device according to claim 1, wherein said air passage converges in a direction away from said fan.

3. The heat-dissipating device according to claim 1, wherein said air passage is provided with a plurality of fin members which project upwardly from said base plate.

4. The heat-dissipating device according to claim 1, wherein said guiding wall members are formed with engaging grooves, said first end of said air guiding tube being formed with engaging protrusions which engage releasably said engaging grooves for mounting said air guiding tube on said base.

5. The heat-dissipating device according to claim 1, further comprising a hollow heat-conducting member which is made of a heat-conducting metal and which has an open first end connected to said guiding wall members and disposed adjacent to said open rear end of said air passage, and an open second end mounted on said first end of said air guiding tube so as to interconnect said base and said air guiding tube and so as to fluidly communicate said air passage and an interior of said air guiding tube, said heat-conducting member having a base board which is adapted to be disposed in contact with the electronic component.

6. The heat-dissipating device according to claim 5, wherein said heat-conducting member has a plurality of fin members that project upwardly from said base board.

* * * * *